United States Patent [19]

Tran et al.

[11] Patent Number: 5,291,036
[45] Date of Patent: Mar. 1, 1994

[54] AMORPHOUS SILICON SENSOR

[75] Inventors: Nang T. Tran, Cottage Grove; William C. Tait, Oak Park Heights, both of Minn.; Franco A. Mori, Celle Ligure, Italy

[73] Assignee: Minnesota Mining and Manufacturing Company, St. Paul, Minn.

[21] Appl. No.: 976,656

[22] Filed: Nov. 16, 1992

Related U.S. Application Data

[63] Continuation of Ser. No. 458,288, Dec. 28, 1989, abandoned.

[51] Int. Cl.$^5$ ................... H01L 27/14; H01L 31/00
[52] U.S. Cl. ........................................ 257/53; 257/458
[58] Field of Search ............... 357/15, 30, 2; 257/53, 257/458

[56] References Cited

U.S. PATENT DOCUMENTS

| | | | |
|---|---|---|---|
| 4,064,521 | 12/1977 | Carlson | 357/2 |
| 4,069,355 | 1/1978 | Lubowski et al. | 427/70 |
| 4,200,473 | 4/1980 | Carlson | 136/89 |
| 4,499,331 | 2/1985 | Hamakawa | 136/258 |
| 4,607,164 | 8/1986 | Kubota et al. | 250/363 |
| 4,660,095 | 4/1987 | Cannella et al. | 358/294 |
| 4,672,454 | 6/1987 | Cannella et al. | 358/213.1 |
| 4,785,186 | 11/1988 | Street et al. | 250/370.14 |
| 4,788,582 | 11/1988 | Yamamoto et al. | 357/71 |
| 4,799,094 | 1/1989 | Rougeot | 357/30 |
| 4,880,987 | 11/1989 | Hosoi et al. | 250/489.1 |

FOREIGN PATENT DOCUMENTS

| | | |
|---|---|---|
| 0163956 | 12/1985 | European Pat. Off. |
| 8204003 | 9/1983 | France |
| 61-196570 | 8/1986 | Japan |
| 61-196571 | 8/1986 | Japan |
| 61-196572 | 8/1986 | Japan |
| 61-196582 | 8/1986 | Japan |
| 1-126583 | 5/1989 | Japan ........................... 250/370.11 |

OTHER PUBLICATIONS

Carlson et al, "Amorphous Silicon Solar Cell", *Applied Physics Letters*, vol. 28, No. 11, pp. 671–673, Jun. 1, 1976.

Nemanich, "Schottky Barriers on a-Si:H", *Semiconductors and Semimetals*, vol. 21, Part C, pp. 375–406, 1984.

Nemanich et al, "Initial Reactions at the Interface of Pt and Amorphous Silicon", *J. Vac. Sci. Technol. B*, pp. 519–523, 1983.

Thompson et al, "Silicide Formation in Pd-a-Si:H Schottky Barriers", *Appl. Phys. Lett.*, pp. 274–276, Aug. 1, 1981.

Deneuville et al, "Influence of Preparation Conditions on Forward-Bias Currents of Amorphous Silicon Schottky Diodes", *J. Appl. Phys.*, pp. 1414–1421, Mar. 1979.

Wronski et al, "Surface States and Barrier Heights of Metal-Amorphous Silicon Schottky Barriers", *Solid State Communications*, vol. 23, pp. 421–424, 1977.

*Primary Examiner*—Andrew J. James
*Assistant Examiner*—Stephen D. Meier
*Attorney, Agent, or Firm*—Kinney & Lange

[57] ABSTRACT

A photosensor device includes doped and undoped hydrogenated amorphous silicon layers adjacent each other and sandwiched between a conductive layer on one side and a metal layer on the other side with the sensor having been annealed under a hydrogen atmosphere and exhibiting low dark currents. The photosensor device is particularly useful as an X-ray image sensing device with the addition of a luminescent layer having at least one X-ray phosphor.

21 Claims, 3 Drawing Sheets

AMORPHOUS SILICON SENSOR

This is a continuation of application Ser. No. 07/458,288, filed Dec. 28, 1989.

BACKGROUND OF THE INVENTION

The present invention relates to amorphous silicon sensors, and in particular, it relates to an amorphous silicon Schottky barrier device having a metal annealed layer.

A semiconductor X-ray sensor is a device for converting X-ray energy to an electrical signal. In general, such sensors sense either the collection of the charge generated by absorption of the incident X-ray photons in the semiconductor itself or the collection of the charge generated in the semiconductor by absorption of visible light photons which are produced by a phosphor or scintillation element excited by the X-rays.

The absorption and conversion of X-rays into light photons by a phosphor screen followed by the conversion of the light photons into electrical charge in the semiconductor device is the more efficient process and is generally chosen whenever the statistical accuracy of the number of photons is preferred to the accuracy in the energy or time resolution of the impinging radiation. This approach is suited for Computer Tomography and Electronic Radiography where the image is close to the quantum limit because of the very low dosage requirement.

Beerlage et al in an article entitled "Digital Slot Radiography Based on a Linear X-Ray Image Intensifier and Two-Dimensional Image Sensors" describe the use of digital radiography. Digital radiography is useful in situations where a large area needs to be imaged. However, the sensors used in digital radiography are expensive hybrid assemblies of discrete single crystal devices and do not allow high resolution and high quality imaging.

A phosphor layer coated on metal electrodes of a junction field effect transistor (JFET) that is deposited on top of amorphous silicon Schottky devices as described in European Patent Application 189,710. A charge is injected and trapped through the source and drain electrodes into the potential well close to the gate electrode. This charge inhibits the conduction between the source and drain electrodes and can be neutralized by charge generation produced by the light from the phosphorus screen. Current between the source and drain electrodes is taken as the signal. In European Patent Application 163,956, an X-ray sensor having an amorphous silicon p-i-n structure is described. The sensor structure is conventional and utilizes single transistors or single diodes as blocking elements in a pixel.

More recently an amorphous silicon X-ray sensor has been described in Japanese laid-open patent applications Nos. 61-196582, 61-196572, 61-196571, and 61-196570. The amorphous silicon X-ray sensor described in these Japanese patent applications is fabricated on glass substrates by the decomposition of $SiH_4/H_2$ mixtures containing the desired amounts of $CH_4$, $B_2H_6$, $PH_3$ in a RF glow discharge deposition system to produce amorphous silicon layers (a-Si:H) with various levels of doping. The structure of the sensor is a glass substrate /ITO (Indium Tin Oxide) layer /p-type a-SiC:H layer /i-type a-Si:H layer /microcrystalline n-type a-Si:H layer /Al layer. The thickness of the p-type and n-type layers is 120–150 Angstrom and 500 Angstrom, respectively. A layer of ZnS (Ni doped) or CaWO4 phosphor is coated on the front surface of the glass substrate. When X-rays are incident on the phosphor, green or blue light is emitted. The light then penetrates the glass substrate and finally enters the p-i-n sensor. However, systems made from this sensor suffer from image contrast losses and are limited in spatial resolution and dynamic range.

Amorphous silicon Schottky barrier diodes and photosensors are well known in the art. Solar cells made using amorphous silicon (a-Si) produced by RF glow discharge in silane were found to contain a much smaller density of defects than samples previously made by direct evaporation or sputtering (D. E. Carlson and C. R. Wronski, "Amorphous Silicon Solar Cell", App. Phys. Lett. Vol. 28, 671 (1976)). Electrical properties of Schottky barriers formed between undoped amorphous silicon and metals such as chromium, palladium, rhodium, and platinum have been studied (C. R. Wronski and D. E. Carlson, "Surface States and Barrier Heights of Metal-Amorphous Silicon Schottky Barriers", Solid State Comm. Vol. 23, 421 (1977)).

Schottky diodes formed between platinum and undoped a-Si:H produced by RF glow discharge in silane/hydrogen mixtures, are shown (A. Deneuville and M. H. Brodsky, "Influence of Preparation Conditions on Forward-Bias Currents of Amorphous Silicon Schottky Diodes", J. Appl. Phys. Vol. 50, 1414 (1979)) to have improved characteristics (closer to ideality) on post deposition annealing at a temperature equal to the deposition temperature. No details of the atmosphere are given explicitly. The formation of metal silicide at the metal/a-Si:H interfaces on post-deposition annealing is studied in M. J. Thompson et al, "Silicide Formation in Pd-a-Si:H Schottky Barriers", Appl. Phys. Lett. Vol. 39, 274 (1981). Annealing was under vacuum at 180° C. for 15 min. Ideality factors improved and became stable on annealing.

In R. J. Nemanich et al, "Initial Reactions at the Interface of Pt and Amorphous Silicon", J. Vac. Sci. detailed studies were described of the Pt silicide layers formed between a thin electron beam deposited Pt layer and a-Si:H layer in a Schottky barrier diode. No photo response characteristics were examined but the backward bias ($-1$ V) current densities were given as about $10^{-10}$A./cm$^2$ as-formed and $10^{-11}$A./cm$^2$ after vacuum annealing at about 200° C.

In R. J. Nemanich in "Semiconductors and Semimetals", Vol. 21, Part C, page 376, edited by Jacques Pankove, Academic Press 1984, metal silicides are reported to occur at junctions with a-Si:H with the following metals, chromium, nickel, palladium, and platinum.

SUMMARY OF THE INVENTION

The present invention includes a photosensor exhibiting low dark current and a high sensitivity to visible light. The sensor includes a doped hydrogenated amorphous silicon layer adjacent an undoped hydrogenated amorphous silicon layer with the two layers sandwiched by a conductive layer on one side and a metal layer having been annealed in a hydrogen atmosphere.

In a preferred embodiment, the photosensor of the present invention is useful as photo-electronic conversion device that is sensitive to X-rays. The photosensor is attached to a substrate and a luminescent layer containing at least one X-ray phosphor is added to the photosensor.

DETAILED DESCRIPTION OF THE PREFERRED EMBODIMENTS

Figure 1:
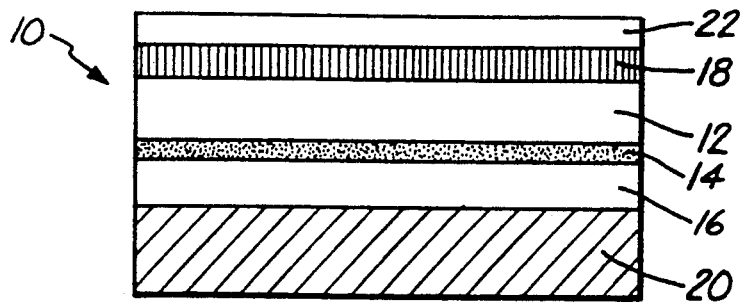
FIG. 1 is a diagrammatical view of a photosensor of the present invention.

An amorphous silicon Schottky barrier photosensor of the present invention is generally illustrated at 10 in FIG. 1. Like reference characters will be used to indicate like elements throughout the drawings.

The photosensor 10 includes an undoped hydrogenated amorphous silicon layer (i-type a-Si:H) 12 and a n-type amorphous silicon layer 14 (n-type a-Si:H). The i-type a-Si:H layer and the n-type a-Si:H layer are disposed adjacent each other. A conductive metal layer 16 is disposed adjacent to the n-type a-Si:H layer on a side opposite from the i-type a-Si:H layer. A metal layer 18 is disposed adjacent side to the i-type a-Si:H layer on side opposite from the n-type a-Si:H layer. The layers 12, 14, 16, and 18 are typically disposed on a substrate 20.

In the embodiment illustrated in FIG. 1, initially the conductive electrode layer 16 is deposited on the substrate 20. The substrate 20 can be made of $SiO_2$ coated silicon wafer, glass, polyimide, polyester, and stainless steel. A glass or quartz substrate is preferred. The conductive electrode layer 16 is deposited on the substrate preferably by sputtering. However, any other suitable process for applying a metal layer to a substrate is within the scope of the present invention.

The primary purpose of layer 16 is to serve as a conductive electrode. Suitable materials for use in layer 16 include tantalum, chromium, silver, aluminum, molybdenum, and titanium, with chromium and tantalum being preferred.

If silver and aluminum are used as metals to form the conductive layer 16, a diffusion barrier layer may be deposited on the conductive layer to prevent migration of the silver and aluminum into the adjacent silicon layer. Diffusion barrier layer materials are known in the art and suitable materials are described by Tran et al. in "Effects of Carbon Profiles at the P/I Interface in Amorphous Silicon Solar Cells," Phys. State. Sol. (a) 99, K13 (1987). A preferred diffusion barrier layer material is titanium nitride such as described by Jacobson et al. in "Amorphous Silicon P-I-N Layers Prepared by a Continuous Deposition Process or Polyimide Web," Proc. 19th IEEE Photovoltaic Specialists Conference 1987, p. 588.

If layer 16 is to serve as a transparent conductive layer, then a transparent conductive oxide (TCO) may be chosen as the material for the conductive layer 16. Typical TCO materials that are well known in the art include indium tin oxide, tin oxide doped with fluorine or antimony, zinc oxide, and cadmium stannate.

The conductive electrode layer 16 is deposited preferably by sputtering. However, any suitable process for forming such a layer on a substrate is within the scope of the present invention.

The n-type a-Si:H amorphous silicon layer 14 in the arrangement illustrated in FIG. 1 is deposited on the conductive layer 16. The i-type a-Si:H layer 12 is then deposited on the n-type a-Si:H layer 14. The i-type a-Si:H layer is preferably deposited at a thickness of approximately 200 to 1500 nm. The n-type a-Si:H amorphous silicon layer is preferably deposited at a thickness of approximately 20 to 100 nm. Both layers 12 and 14 are preferably deposited by a Plasma Enhanced Chemical Vapor Deposition (PECVD). PECVD utilizes glow discharge deposition in an atmosphere that includes $SiH_4$ and hydrogen in preferably a ratio of 1:9 at a total pressure of $SiH_4$ and hydrogen of approximately 1 Torr. The temperature of the $SiH_4$ substrate is in the range of 150° C. to 350° C. and preferably about 250° C.

The n-type a-Si:H layer is formed by the addition of a dopant such as $PH_3$ or $AsH_3$ to the mixture of $SiH_4$ and hydrogen in the ratio of about 1:100, also at a total pressure of approximately 1 Torr.

The i-type A-Si:H layer can also be made of a silicon-based alloy such as silicon-germanium or silicon tin.

Other plasma enhanced chemical vapor deposition systems may also be used such as electron cyclotron resonance chemical vapor deposition and photo-assisted chemical vapor deposition. In addition, other techniques such as sputtering, electron beam evaporation, or low pressure chemical vapor deposition may also be used to form the doped and undoped amorphous silicon layers.

The metal layer 18 is then deposited on the i-type a-Si:H layer 12. Material used to form the layer 18 includes metals that may form silicides at low temperatures. Such metals include platinum, palladium, chromium, tungsten, and iron, with platinum being preferred.

The layer 18 is preferably deposited by sputtering and is deposited to a thickness in the range of about 2 to 15 nm. After the layer 18 has been deposited, the layer 18 is subjected to an annealing process in a hydrogen atmosphere which is believed to reduce defect densities at the metal layer 18/a-Si:H layer 12 interface. Such a process reduces the dark current exhibited by the photosensor of the present invention by two to three orders of magnitude as compared to photosensors that have not been annealed.

The annealing process of the present invention is carried out in a chamber that is evacuated to approximately $2 \times 10^{-6}$ Torr. Hydrogen is introduced into the chamber at a slow flow rate backed up with a mechanical pump, to a total pressure between 0.2 and 1000 Torr to minimize the occurrence of contaminants in the chamber which can be critical to the success of the annealing process. Optionally, an inert gas such as nitrogen, argon, xenon, krypton, or helium can be mixed with the hydrogen. By inert gas is meant gas that under annealing conditions is not chemically reactive with other materials present in the chamber. The photosensor 10 is then heated to a temperature in the range of about 150° C. to 350° C. and preferably to a range between about 200° C. to 300° C. The temperature is kept at the selected range for 10 to 60 minutes before being cooled down to room temperature.

Alternatively, the hydrogen annealing can be carried out in plasma hydrogenation at a pressure of approximately 0.1 to 1.5 Torr and in a temperature range of approximately 150° C. to 350° C. for approximately 10 to 60 minutes. The temperature is thereafter brought back down to room temperature. The plasma hydrogenation can take place in the plasma-enhanced chemical vapor depositions system, electron cyclotron resonance chemical vapor deposition, or other plasma systems.

An optional anti-reflection layer 22 may be deposited on to the layer 18 to a thickness in the range of 50 to 100 nm. Suitable materials for layer 22 include indium tin oxide (ITO), $SnO_2$, ZnO, ZnS and $Si_3N_4$.

The layers 16 and 18 may be reversed such that the metal layer is adjacent the substrate and the conductive layer 16 is on the opposite side of the amorphous silicon layers. If a transparent substrate is used and the activating light to which the device is subjected is incident on the substrate, then the layer 22 is made of a transparent conductive oxide and is placed between the layer 18 and the substrate 20.

The process of the present invention produces a high quality amorphous silicon Schottky barrier photosensor. When activated, with a voltage of $-1$ V applied between the conductive layer 16 and the metal layer 18, a quantum efficiency in the range of 20 percent to 50 percent is achieved without an anti-reflection coating. With an anti-reflection coating, a quantum efficiency of 50 percent or higher is achieved under green light at a wave length of 545 nm over a wide range of intensities of up to 2.6 microwatts/$cm^2$. By quantum efficiency is meant the ratio of the number of collected charge carriers to the number of incident photons.

Photosensors of the present invention exhibit dark currents of not more than $10^{-10}$A./$cm^2$ at a temperature in the approximate range of 10° C. and 30° C. under an activation voltage of approximately $-1$ V applied between the conductive layer and the metal layer and as low as $10^{-11}$A./$cm^2$ as compared with $10^{-9}$A./$cm^2$ for crystal silicon photosensors. The low dark current is surprising since the device before annealing has a very high dark current such as $10^{-7}$A./$cm^2$.

Other deposition methods such as E-beam deposition provide metal layers which give dark currents that are lower than dark currents in layers which are produced using sputtering procedures. In addition, low dark currents can be achieved using simple vacuum annealing. However, E-beam deposition and simple vacuum annealing are not suitable techniques for producing photosensors in production quantities. In the devices of the present invention, thickness of the metal layer is important. For example, when platinum is used as the metal of choice, a thickness range of 100 to 150Å is needed. Variation of the thickness will affect the performance of the device as a sensor. Sputtering is the preferred technique for forming a uniform layer over a large area, for example, several feet wide. The transport of material is made by the physical ejection of particles from the sputtering target by a momentum exchange rather than a chemical or thermal process. Using E-beam deposition, a uniform thickness is difficult to achieve even on an area that is 4 cm wide.

Dark currents of photosensors annealed under different atmospheres such as hydrogen, argon, and simple vacuum annealing were measured. Results indicated that annealing in a hydrogen atmosphere gave the best results. The dark current of the photosensor annealed in the hydrogen atmosphere of the present invention was more than one order of magnitude lower than the dark current of photosensors annealed under argon or simple vacuum annealing.

The device 10 is particularly useful as a photo-electronic conversion device that is sensitive to X-rays for use as a photo-imaging element or a dosimeter in medical and industrial radiography. The device of the present invention has a high sensitivity to visible light and a very low dark current. The device of the present invention is useful in producing an X-ray sensor having a high signal-to-noise ratio in a two dimensional array of photo-electronic X-ray sensors when disposed on a flexible substrate. The X-ray sensor is producible in an integrated array of such sensors on the substrate.

For use as an X-ray sensor, a luminescent layer is added to the photosensor described with reference to FIG. 1. The addition of the luminescent layer provides the sensor with the capability of detecting X-rays. Preferably, the luminescent layer is fluorescent and contains at least one X-ray phosphor. By luminescent is meant both fluorescent and phosphorescent materials, with fluorescent being characterized as having negligible after-glow with such after-glow being pronounced in the phosphorescent material.

The phosphors are chosen from those which emit visible light preferably in the wavelength range where a-Si:H photosensitive sensors are most sensitive, that is 400 nm to 700 nm. Enhancement of red sensitivity of the photosensor of the present invention can be accomplished by alloying the silicon with germanium, and enhancement of blue sensitivity can be achieved by alloying the silicon with carbon resulting from adding methane to the silane during the plasma enhanced chemical vapor deposition process.

Examples of suitable phosphors for use with the sensor of the present invention include gadolinium oxysulfide doped with terbium or with europium or samarium, yttrium oxide, calcium tungstate, and zinc sulfide. A preferred phosphor is gadolinium oxysulfide doped with terbium since the emitted wavelength of this phosphor matches the peak sensitivity of the photosensor of the present invention. The luminescent layers of the present invention are typically in the thickness range of about 300 to 200 microns.

FIGS. 2A, 2B, 2C, and 2D illustrate various alternative arrangements of the sensor of the present invention including a luminescent layer containing one X-ray phosphor. In all cases, the layers are deposited as described with reference to FIG. 1.

Figure 2A:
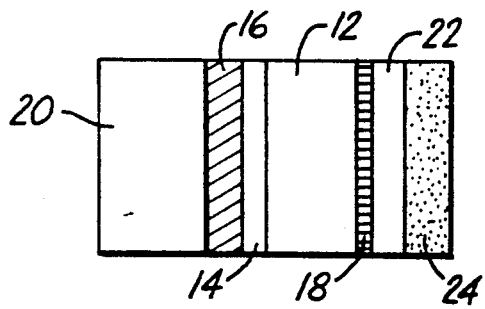
FIGS. 2A-2D are diagrammatical views of X-ray sensors of the present invention.

In the arrangement illustrated in FIG. 2A, the layers are arranged in the same order as in FIG. 1, that is the metal layer 16 is adjacent to the substrate 20 with the n-type a-Si:H layer 14 adjacent the conductive layer 16. The i-type a-Si:H layer 12 is adjacent the n-type a-Si:H layer 14. The metal layer is deposited on the i-type a-Si:H layer 12 with the antireflection layer 22 deposited on the metal layer 18. A luminescent layer containing an X-ray phosphor is deposited on the antireflection layer so that the sensor detects X-rays incident from the general direction of arrow 26.

Figure 2B:
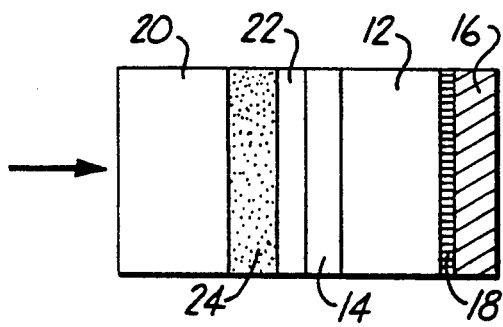

The arrangement illustrated in FIG. 2B includes the luminescent layer 24 being deposited directly on the substrate 20 with the layer 22 being deposited on the luminescent layer 24 and being made of a transparent conductive oxide. The n-type a-Si:H layer 14 is deposited on the layer 22 with the i-type a-Si:H layer 12 being deposited then on the n-type a-Si:H layer. The metal layer 18 is then deposited directly on the layer 12 with the conductive layer 16 being deposited on the metal layer 18. In the arrangement of FIG. 2B, the substrate 20 is transparent to X-rays and the sensor detects X-rays incident on the substrate 20 from the general direction of arrow 28.

Figure 2C:
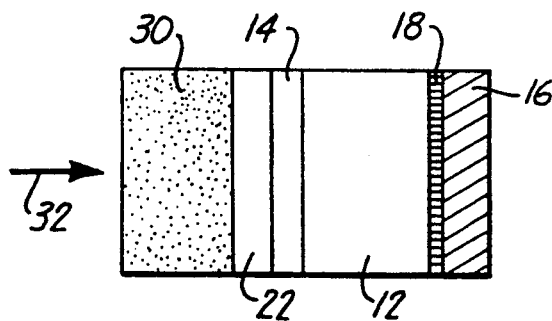

In the arrangement of FIG. 2C, the layers 22, 14, 12, 18, and 16 are in the same order as the arrangement of FIG. 2B, except that the X-ray phosphor is now included in the substrate as a combined substrate and luminescent layer 30. X-rays are detected from the general direction of arrow 32, that is incident on the combined substrate and phosphor layer 30.

With respect to the arrangements illustrated in FIGS. 2B and 2C, the layer 22 performs as both an electrode and an anti-reflection layer.

Figure 2D:
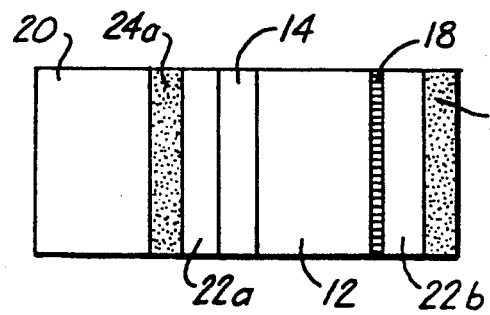

The embodiment illustrated in FIG. 2D, employs an arrangement that increases the optical efficiency of the luminescent layers. The n-type a-Si:H and i-type a-Si:H layers 14 and 12 are adjacent each other with the metal layer adjacent the i-type a-Si:H layer 12. On opposing sides of the combined layers 14, 12, and 18, are included layers 22A (a TCO layer) and 22B (an anti-reflection layer). Adjacent both layers 22A and 22B on outer sides are luminescent layers 24A and 24B. The substrate is disposed adjacent the luminescent layer 24A. The embodiment of FIG. 2D provides greater stopping power to X-rays while avoiding the optical inefficiency of excessive phosphor thickness of a single luminescent layer through the use of two luminescent layers.

Other methods of increasing the optical efficiency of luminescent layers are includable in the present invention. These include the use of back reflecting layers which prevent escape of emitted light from a surface of the phosphor layer facing away from the photodetector. The phosphor can be a columnar structure phosphor. When the X-ray device of the present invention is used in a two-dimensional array, preferably, the columnar size of the phosphor is approximately equal to the pixel size of the array. Structured phosphors for radiographic imaging are discussed in European Patent Application 175,578 and in the Laboski et al. U.S. Pat. No. 4,069,355. Columnar phosphor improves the quantum absorption of X-rays leading to improved signal-to-noise ratio, and improves the spatial resolution and sharpness of the image in the X-ray sensor.

Figure 3A:
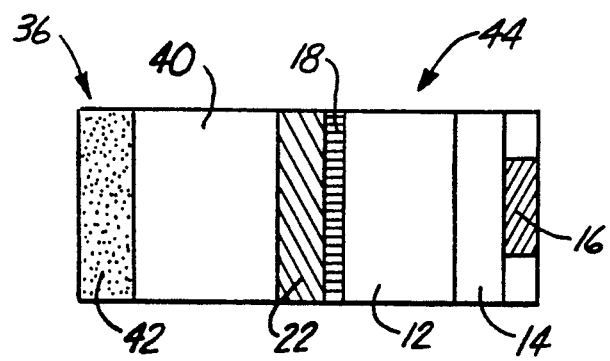
FIGS. 3A and 3B are diagrammatical views of alternative embodiments of X-rays sensors of the present invention.
Figure 3B:
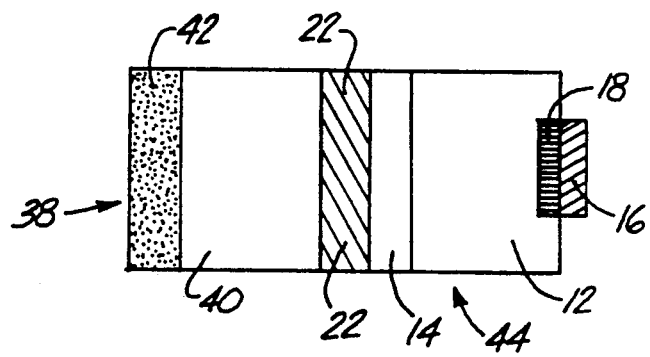

Alternative embodiments 36 and 38 are illustrated in FIGS. 3A and 3B, respectively. The embodiments 36 and 38 include the common feature of a transparent glass substrate 40 with a luminescent layer 42 being disposed on one side and the photosensor of the present invention 44 being disposed on an opposite side of the glass substrate 40. In the embodiment 36, the metal layer 18, i-type a-Si:H layer 12 and n-type a-Si:H layer 14 are in reverse order from those layers illustrated in the embodiment 38 of FIG. 4B. The following examples are for illustrative purposes and are not to be considered as limiting the present invention.

EXAMPLE 1

A photosensor of the general arrangement illustrated in FIG. 1 was produced by initially depositing an approximately 1000Å thick conductive tantalum metal electrode layer by sputtering on a $SiO_2$ coated silicon wafer for use as the conductive layer. Next, using plasma enhanced chemical vapor deposition, an n-type hydrogenated amorphous silicon (n-type a-Si:H) of approximately 30 nm thickness was deposited as the ohmic contact on the tantalum metal layer. Next, an undoped hydrogenated amorphous silicon (i-type a-Si:H) layer was deposited by plasma enhanced chemical vapor deposition on the n-type a-Si:H layer of approximately 500 nm thickness. The deposition of both the n-type and i-type a-Si:H layers was performed utilizing a capacitively coupled reactor which consisted of two 5-inch by 5-inch parallel plate electrodes placed approximately ¾ inch apart. The discharge was excited by a 13.56 MHz RF generator and the system was equipped with a turbomolecular pump which was backed by a mechanical pump. A source gas was fed into the reactor through a bottom RF driven electrode which had multiple holes based on the "shower head" concept. Both amorphous silicon layers were prepared at an RF power of 6–10 W. Both amorphous silicon layers were produced in sequence in an atmosphere of $SiH_4$ and hydrogen at a ratio of 1:9, at a total pressure of approximately 1 Torr, and with the glass substrate temperature being approximately 250° C. The n-type a-Si:H layer was formed with the addition of $PH_3$ to the gas mixture in the ratio of 1:100 at a total pressure of 1 Torr.

In order to eliminate cross contamination of phosphorus carried over from the deposition of the n-type a-Si:H to the i-type a-Si:H layer, the chamber was pumped with a turbomolecular pump for 30 minutes before the deposition of the i-type a-Si:H layer.

Next, a layer of platinum metal was sputtered on to the i-type a-Si:H layer to a thickness of approximately 10 nm. The platinum was then annealed under the following conditions. The chamber was evacuated to $2 \times 10^{-6}$ Torr. Hydrogen was introduced into the chamber at a flow rate of 5 sccm to a total pressure of 1 Torr. The photosensor was then heated to approximately 200° C. and maintained at this temperature for approximately 30 minutes before being cooled down to room temperature. Hydrogen was introduced into the chamber in a dynamic mode to avoid contamination, that is hydrogen flow backed-up with a mechanical pump.

Next, an anti-reflection layer of indium tin oxide (ITO) was then deposited on to the platinum layer to a thickness of approximately 70 nm.

Figure 4:
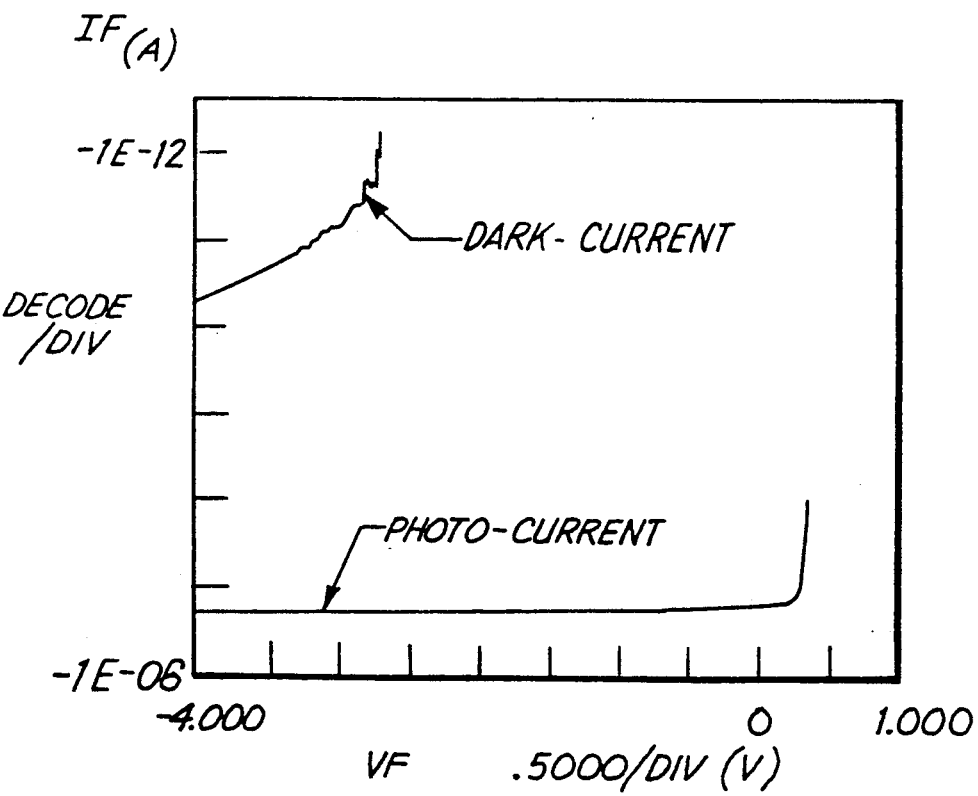
FIG. 4 is a graphical view illustrating light and dark current characteristics of a photosensor of the present invention.
Figure 5:
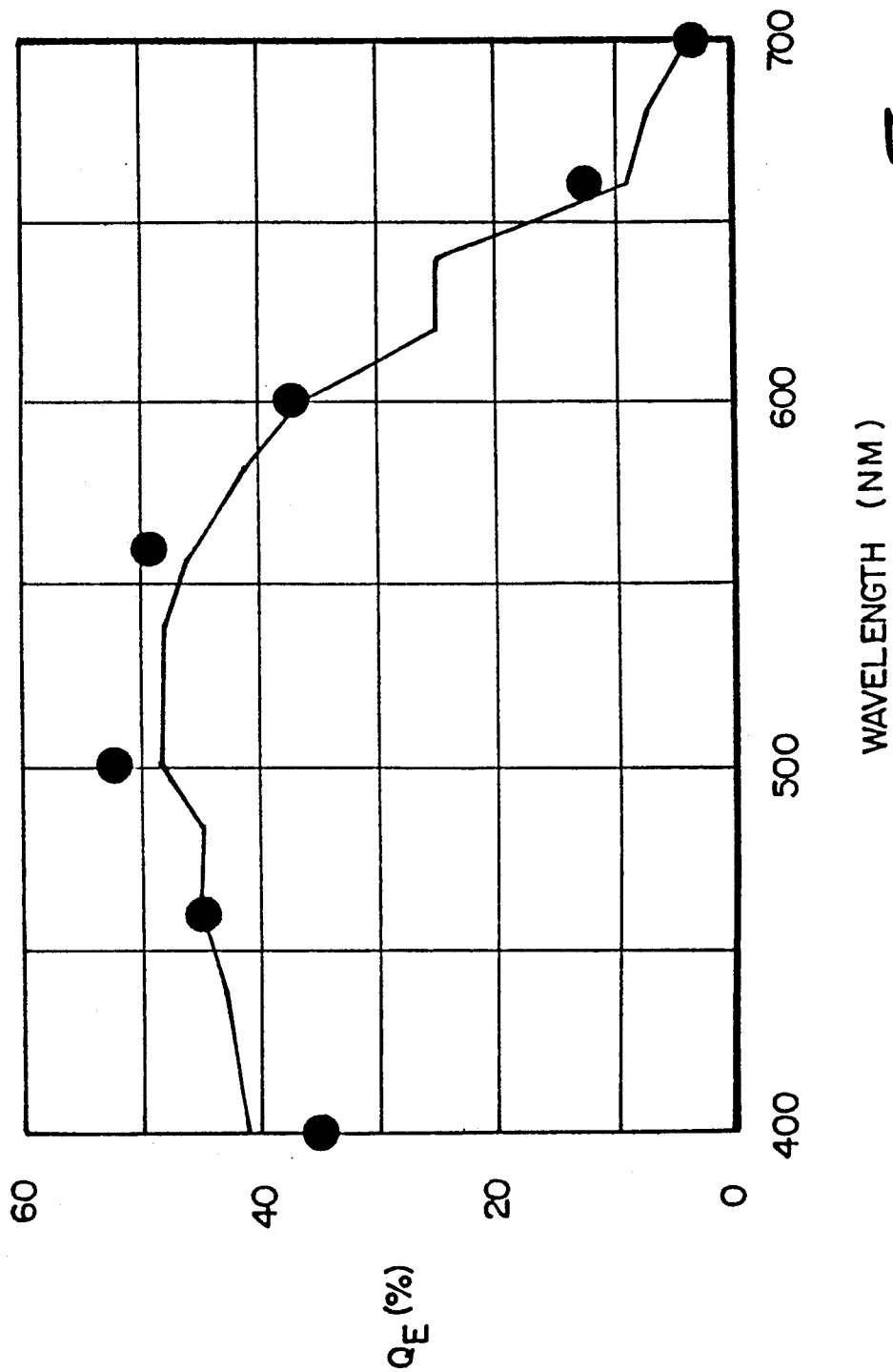
FIG. 5 is a graphical view illustrating quantum efficiency of a amorphous silicon sensor of the present invention.

The photosensor produced was a high quality amorphous silicon Schottky barrier photosensor which when activated with a voltage of $-1$ V applied between the platinum layer and the tantalum metal electrode layer achieved the quantum efficiency of 25 percent without anti-reflection coating, and 50 percent with an anti-reflection coating under green light of a wavelength of approximately 545 nm at an intensity of 2.6 microwatts/cm². Current-voltage characteristics of the amorphous silicon Schottky barrier sensor are illustrated in FIG. 4. A dark current as low as $10^{-11}$ A/cm² at $-1$ V and a photo current of $10^{-6}$ A/cm² was achieved at 2.6 microwatts/cm². A quantum efficiency as high as 45 percent at 545 nm without an anti-reflection layer was demonstrated, as illustrated in FIG. 5.

Major optical and electrical properties of the i-type a-Si:H layer are as follows:

1. Optical band gap of 1.75 eV.
2. ESR spin density of $10^{15}$ cm$^{-3}$.
3. IR absorption peaks at 2000 cm$^{-1}$ and 630 cm$^{-1}$.
4. Photo to dark conductively ratio of $10^5$ (AM1).

The above readings indicate a high quality amorphous silicon device.

EXAMPLE 2

An X-ray sensitive device was constructed using the photosensor of Example 1 by coating a phosphor layer of gadolinium oxysulfide doped with terbium approximately 70 microns thick on the ITO layer. The gadolinium oxysulfide doped with terbium layer was obtained by a sedimentation technique from a suspension of phosphor powder in a binder as follows: 7 grams of phosphor were dispersed in 10 grams of polymethylmethacrylate with 10 grams of butylacrylate, 10 grams of methylisobutylketone, and 10 grams of ethylacetate. The above gave a dispersion having a grain size and size distribution that is typical of a commercially available X-ray phosphor marketed by 3M Company of St. Paul, Minn., under the trademark T6 TRIMAX.

The X-ray sensor of this example was measured at 90 KVp, 200 msec and a dynamic range of between $10^3$ to $10^4$ was achieved. These results indicate that the device is adequate for an X-ray sensor.

Although the present invention has been described with reference to preferred embodiments, workers skilled in the art will recognize that changes may be made in form and detail without departing from the spirit and scope of the invention.

What is claimed is:

1. A sensor device comprising:
   a first luminescent layer formed columnar phosphor;
   a transparent conducting oxide layer adjacent said first luminescent layer;
   a doped hydrogenated amorphous silicon layer;
   an undoped hydrogenated layer of amorphous silicon or an amorphous silicon alloy adjacent the doped hydrogenated amorphous silicon layer;
   a metal layer including metal silicide annealed in hydrogen plasma at a temperature of at least 150° C.
   wherein the doped and undoped hydrogenated amorphous silicon layers are disposed between the metal layer and the conductive oxide layer; and
   wherein the device exhibits dark currents of not more than approximately $10^{-10}$ A/cm$^2$ in a temperature range of approximately 10° C. to 30° C. at approximately $-1$ V.

2. The device of claim 1 and further including an anti-reflection layer adjacent the metal layer.

3. The device of claim 2 wherein the anti-reflection layer is made of a transparent conductive oxide.

4. The device of claim 2 and further including a conductive layer adjacent the metal layer.

5. The device of claim 2 and further including a luminescent layer disposed adjacent the anti-reflection layer.

6. The device of claim 1 wherein the conductive layer is metal and further including an anti-reflection layer disposed adjacent the metal layer.

7. The device of claim 6 wherein the anti-reflection layer is made of a transparent conductive oxide.

8. The device of claim 1 and wherein the first luminescent layer is a substrate disposed adjacent the conductive oxide layer.

9. The device of claim 1 and further including an additional transparent conductive oxide layer disposed adjacent the metal layer, and a second luminescent layer disposed adjacent the additional transparent conductive oxide layer.

10. The device of claim 1 and further including a glass substrate disposed adjacent the conductive oxide layer and wherein the first luminescent layer is disposed on the glass substrate on a side opposite from the conductive oxide layer.

11. The device of claim 1 wherein the doped hydrogenated amorphous silicon layer is of a thickness in the range of approximately 20 to 100 nm.

12. The device of claim 1 wherein the undoped hydrogenated amorphous silicon layer has a spectral sensitivity in the wavelength range of approximately 400 nm to 700 nm.

13. The device of claim 1 wherein the amorphous silicon alloy is silicon germanium.

14. The device of claim 1 wherein the amorphous silicon alloy is silicon tin.

15. The device of claim 1 wherein the undoped hydrogenated amorphous silicon layer has a thickness of approximately in the range of 200 to 1500 nm.

16. The device of claim 1 characterized by dark currents of not more than approximately $10^{-10}$ A/cm$^2$ at a temperature in the approximate range of 10° C. and 30° C. under an activation voltage of approximately $-1$ V applied between the conductive layer and the metal layer.

17. A sensor device produced by the following process comprising:
    sputtering on a substrate an electrode layer;
    depositing a doped hydrogenated amorphous silicon layer and an undoped hydrogenated amorphous silicon layer adjacent the doped hydrogenated amorphous silicon layer;
    sputtering a metal layer; and
    subsequently annealing the device in a hydrogen plasma atmosphere at a temperature of at least 150° C. for less than 60 minutes wherein the device after annealing exhibits dark currents of not more than approximately $10^{-10}$ A/cm$^2$ in a temperature range of approximately 10° C. to 30° C. at approximately $-1$ V.

18. The product of claim 17 and further including a first luminescent layer wherein the first luminescent layer is formed of columnar phosphor adjacent the electrode layer, and wherein the electrode layer is formed of a transparent conductive oxide.

19. The device of claim 18 and further including an additional transparent conductive oxide layer disposed adjacent the metal layer and a second luminescent layer disposed adjacent the additional transparent conductive oxide layer.

20. The device of claim 17 wherein the amorphous silicon layers are deposited by sputtering.

21. The device of claim 17 wherein the amorphous silicon layers are deposited by plasma-enhanced chemical vapor deposition techniques.

* * * * *

UNITED STATES PATENT AND TRADEMARK OFFICE
CERTIFICATE OF CORRECTION

PATENT NO. : 5,291,036

DATED : March 1, 1994

INVENTOR(S) : NANG T. TRAN, WILLIAM C. TAIT, FRANCO A. MORI

It is certified that error appears in the above-identified patent and that said Letters Patent is hereby corrected as shown below:

Col. 3, line 57, delete "99", insert --<u>99</u>--

Col. 5, line 6, delete "depositions", insert --deposition--

Col. 5, line 51, delete "150Å ", insert --150 A°--

Col. 7, line 61, delete "1000Å , insert --1000 A°--

Signed and Sealed this

Twentieth Day of September, 1994

BRUCE LEHMAN

Attest:

Attesting Officer

Commissioner of Patents and Trademarks